US012394807B2

United States Patent
Tao et al.

(10) Patent No.: US 12,394,807 B2
(45) Date of Patent: Aug. 19, 2025

(54) DISTRIBUTED FUEL CELL POWER SUPPLY CABINET

(71) Applicant: Xi'an Jiaotong University, Xi'an (CN)

(72) Inventors: Wenquan Tao, Xi'an (CN); Zixing Wang, Xi'an (CN); Nan Li, Xi'an (CN); Pu He, Xi'an (CN); Li Chen, Xi'an (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 332 days.

(21) Appl. No.: 18/190,950

(22) Filed: Mar. 27, 2023

(65) Prior Publication Data

US 2024/0014416 A1   Jan. 11, 2024

(30) Foreign Application Priority Data

Jul. 5, 2022  (CN) .......................... 202210785019.6

(51) Int. Cl.
*H01M 8/04029*  (2016.01)
*H01M 8/0444*  (2016.01)
(Continued)

(52) U.S. Cl.
CPC ... *H01M 8/04029* (2013.01); *H01M 8/04462* (2013.01); *H01M 8/04604* (2013.01);
(Continued)

(58) Field of Classification Search
CPC ......... H01M 8/04007; H01M 8/04029; H01M 8/04298; H01M 8/2465; H01M 8/247;
(Continued)

(56) References Cited

U.S. PATENT DOCUMENTS

| 11,528,829 B2 * | 12/2022 | Yuan ................... H05K 7/20754 |
| 2004/0219405 A1 * | 11/2004 | Lyon ................. H01M 8/04753 |
| | | 429/430 |

(Continued)

FOREIGN PATENT DOCUMENTS

| CN | 114071963 A | * | 2/2022 |
| CN | 115623745 A | * | 1/2023 |

OTHER PUBLICATIONS

Machine translation completed Apr. 17, 2025, CN 114071963-A by Cai et al. (Year: 2025).*

*Primary Examiner* — Jayprakash N Gandhi
*Assistant Examiner* — Steven Ngo
(74) *Attorney, Agent, or Firm* — Gallium Law; Jacob Panangat; Isabel Fox (57) ABSTRACT

Disclosed is a fuel cell power supply cabinet, comprising a modified cabinet integrated with a fuel cell system, and a coupled thermal management system of a fuel cell and a data center. The fuel cell system is integrated in the cabinet, and a server group and cooling equipment thereof are integrated in the upper part of the cabinet. The fuel cell system comprises a fuel cell stack, a plate heat exchanger, and a fuel cell control module. The fuel cell control module comprises a hydrogen module, an air module, a cooling module, an exhaust module, and a power source module. A standard server group, a liquid-air heat exchanger and a fan matrix are arranged at the upper part of the cabinet. The coupled thermal management system of the fuel cell and the data center comprises coupled management of server thermal management, fuel cell thermal management and computer room thermal management.

9 Claims, 4 Drawing Sheets (51) Int. Cl.

| | |
|---|---|
| *H01M 8/04537* | (2016.01) |
| *H01M 8/04858* | (2016.01) |
| *H01M 8/0662* | (2016.01) |
| *H01M 8/2475* | (2016.01) |
| *H01M 16/00* | (2006.01) |
| *H02B 1/30* | (2006.01) |
| *H05K 7/14* | (2006.01) |
| *H05K 7/20* | (2006.01) |

(52) U.S. Cl.
CPC ..... *H01M 8/04925* (2013.01); *H01M 8/0662* (2013.01); *H01M 8/2475* (2013.01); *H01M 16/006* (2013.01); *H02B 1/30* (2013.01); *H05K 7/1492* (2013.01); *H05K 7/20718* (2013.01); *H01M 2250/10* (2013.01); *Y02E 60/50* (2013.01)

(58) Field of Classification Search
CPC . H01M 8/2475; H01M 2250/10; Y02E 60/30; Y02E 60/50; H02B 1/26; H02B 1/30; H05K 7/1488; H05K 7/1492; H05K 7/20009; H05K 7/20136; H05K 7/20218; H05K 7/20263; H05K 7/20272; H05K 7/2029; H05K 7/20318; H05K 7/20327; H05K 7/20536; H05K 7/20554; H05K 7/20572; H05K 7/20627; H05K 7/20645; H05K 7/20663; H05K 7/20681; H05K 7/20709; H05K 7/20718; H05K 7/20736; H05K 7/20763; H05K 7/20781; H05K 7/208; H05K 7/20818

See application file for complete search history.

(56) References Cited

U.S. PATENT DOCUMENTS

| | | | |
|---|---|---|---|
| 2016/0079613 A1* | 3/2016 | Gurunathan | H05K 7/20154 361/695 |
| 2018/0107260 A1* | 4/2018 | Cifala | G06F 1/26 |

* cited by examiner

DISTRIBUTED FUEL CELL POWER SUPPLY CABINET

CROSS-REFERENCE TO RELATED APPLICATION

This patent application claims the benefit and priority of Chinese Patent Application No. 202210785019.6, filed with the China National Intellectual Property Administration on Jul. 5, 2022, the disclosure of which is incorporated by reference herein in its entirety as part of the present application.

TECHNICAL FIELD

The present disclosure belongs to the technical field of fuel cells, and in particular, relates to a distributed fuel cell power supply cabinet, as well as a coupled thermal management architecture for a fuel cell and a data center.

BACKGROUND

Compared to regions such as the United States and Europe, China will become the region with the largest data center scale in the world. With such a huge data center scale, its power consumption is also huge, having reached 125 billion kWh in 2017, exceeding the total power generation of the Three Gorges Dam and Gezhouba Hydropower Plant. With the rapid increase in power consumption of the data center, the demand for improving its electric energy utilization efficiency and using renewable energy for power supply is beginning to emerge.

In the existing patents: a data center power supply and distribution and heat energy utilization system (Publication number: CN112134279A), a data center power supply and distribution and heat energy utilization system are disclosed. In the system, a hydrogen energy conversion device is used to power the data center by replacing the traditional diesel engine, and the waste heat generated by the hydrogen energy conversion device is fully utilized to cool the data center. It points out that a hydrogen fuel cell is used as peak-shaving and valley-filling equipment of mains supply, and the waste heat generated by the hydrogen fuel cell is used as driving energy for hydrogen supply and absorption refrigeration equipment. However, the mains supply is still used as the source of energy supply at night, and the cleanliness of the mains supply is difficult to guarantee.

For the absorption refrigeration equipment used in the above patent, there is a patent: an integrated cabinet powered and refrigerated by a fuel cell (Patent number: CN114071963A), where an absorption refrigeration system is directly integrated into the cabinet, fuel cells and absorption refrigeration equipment are utilized, the fuel cells are directly combined with a terminal energy-consuming cabinet so that the independent electricity consumption and cooling of a single cabinet can be achieved. However, the specific physical arrangement of modular equipment in the cabinet and corresponding module dimensions are not described in detail in the patent (CN114071963A), only the system is described through efficiency, power, and other parameters, thus it is hard to integrate a high-power server group, a high-power fuel cell, and a high-power absorption refrigeration module under the conventional cabinet dimension (the length, width, and height of the standard 42U cabinet are generally no more than 600 mm*1200 mm*2200 mm). The cabinet needs to be customized during actual application, which is not conducive to promotional use. In terms of thermal management, the design of integrating the absorption refrigeration equipment into the cabinet is radical. At the moment, the cooling capacity required for cooling the server depends entirely on the heat generated by the fuel cells, i.e., the temperature and the response time of the heat source required by the absorption refrigeration equipment depend entirely on the real-time working condition adjustment of the fuel cell, it is hard to guarantee the stable cooling for the server. If the cabinet load fluctuates in a large transient state, the heat source provided by the fuel cell will have a long response time, which may result in the shortage of the server cooling capacity supply and easily lead to thermal imbalance.

None of the patents above considers how the fuel cells are configured in the data center, describes how the necessary subsystems supporting the operation of the fuel cell stack are integrated into the data center cabinet and the data center computer room to guarantee the stable operation of the fuel cell stack in detail and describes how the used cooling equipment is physically coupled to the data center computer room, the server, and the fuel cell in terms of thermal management, and thus the feasibility of engineering application is greatly reduced.

SUMMARY

An objective of the present disclosure is to provide a distributed fuel cell power supply cabinet, which transforms and combines a cooling system of an existing data center and the standard dimension (42U) of the data center computer cabinet. Based on the specific dimension (partially estimated dimension) and operation parameters of important equipment, a detailed physical location design, an electricity supply design, and an in-cabinet heat management scheme design are proposed for a scheme of applying fuel cells to a power supply in the single cabinet. The objective is to solve the problem that the data center uses the hydrogen fuel cell technology to perform power supply and achieve efficient coupled thermal management, achieve organic coupling operation of the data center and hydrogen fuel cells, and provide application ideas of fuel cell technology for a zero-carbon data center.

To achieve the objective above, the present disclosure employs the following technical solutions:

A distributed fuel cell power supply data center cabinet includes a modified cabinet integrated with a fuel cell system, and a coupled thermal management system of a fuel cell and a data center.

The fuel cell system is integrated in the lower part of the cabinet, and a server group and cooling equipment thereof are integrated in the upper part of the cabinet.

The fuel cell system includes a fuel cell stack, a plate heat exchanger, and a fuel cell control module.

The fuel cell control module includes a hydrogen module, an air module, a cooling module, an exhaust module, and a power source module. The modules are connected to the fuel cell stack by pipelines or circuits and are entirely integrated in the lower part of the cabinet. The hydrogen module is connected to a hydrogen supply module outside the cabinet by a pipeline, and the tail end of the hydrogen module is connected to the fuel cell stack. The air module is connected to an air supply module outside the cabinet by a pipeline, and the tail end of the air supply module is connected to the fuel cell stack. The exhaust module is connected to an exhaust processing module outside the cabinet by a pipeline, and the starting end is connected to the fuel cell stack. The cooling module is in a closed-loop connection with the fuel cell stack by a pipeline. The plate heat exchanger is one part of the cooling module, and the coolant of the plate heat exchanger is from the liquid outlet of the liquid-air heat exchanger. The power source module of the fuel cell control system is used for electric power supply.

The upper part of the cabinet includes a standard server group, a liquid-air heat exchanger, and a fan matrix, which work together to achieve the cooling of the server.

The coupled thermal management system of the fuel cell and the data center includes coupled management of server thermal management, fuel cell thermal management, and computer room thermal management. The server thermal management is achieved through the liquid-air heat exchanger and the fan matrix; the fuel cell thermal management is achieved by discharging a part of low-temperature returned liquid from the liquid-air heat exchanger; and the computer room thermal management is achieved through the cooling equipment outside the computer room of data center.

A further improvement of the present disclosure is that the coolant of the liquid-air heat exchanger and the plate heat exchanger are both from the cooling equipment outside the computer room.

A further improvement of the present disclosure is that coolant includes water, fluorinate liquid, or other coolant types commonly used in the data center.

A further improvement of the present disclosure is that the coolant at the inlet of the liquid-air heat exchanger is heated into low-temperature returned liquid at a slightly higher temperature at the outlet of the liquid-air heat exchanger. After being discharged, the low-temperature returned liquid is diverted by a flow distribution valve, one part of which is delivered to the plate heat exchanger, and the other part is delivered to the cooling equipment outside the computer room of the data center. The low-temperature returned liquid delivered to the plate heat exchanger becomes a stream of high-temperature returned liquid after completing the heat exchange in the plate heat exchanger, and then is delivered to the outside of the computer room by heat insulation pipelines.

A further improvement of the present disclosure is that the power source module of the fuel cell control system adopts different configuration solutions according to server load power input.

A further improvement of the present disclosure is that the cabinet and a data center 42U standard cabinet are consistent in geometric dimension, and the front and rear positions of the cabinet are perforated to achieve the arrangement and connection of hydrogen, air, and exhaust pipelines related to the fuel cell system.

A further improvement of the present disclosure is that the hydrogen supply module includes a hydrogen cylinder, a pressure-reducing valve, as well as a pipeline system connected to the computer room; the air supply module includes a compressor, a control valve, a filter, as well as a pipeline system connected to the computer room; and the exhaust treatment module includes a hydrogen concentration monitor, as well as a pipeline system for collecting the exhaust of each cabinet and connected outside the computer room.

A further improvement of the present disclosure is that when the server load is a direct current load, the power source module of the fuel cell control system is set as follows: the fuel cell stack is connected to a boost DC-DC, the mains supply is connected to an AC-DC converter, and then the connected fuel cell stack and boost DC-DC and the connected mains supply and AC-DC converter are connected in parallel and then are connected to a lithium battery in parallel, and three paths are aggregated and then directly supplied to the server load.

When the server load is an alternating current load, the power source module is set as follows: the fuel cell is connected to a boost DC-DC, then the connected fuel cell and boost DC-DC are connected to a lithium battery in parallel, the connected fuel cell and boost DC-DC and the lithium battery are aggregated and then connected to a DC-AC converter to obtain alternating current and then are connected to the mains supply in parallel to supply power for the alternating current server load.

A further improvement of the present disclosure is that the cooling equipment outside the computer room of the data center includes a condenser, a cold source system, a liquid pump, a heat storage tank, and waste heat utilization equipment. The condenser and the cold source system are configured to complete the generation and storage of refrigerating fluid, and then the liquid pump is configured to pump the refrigerating fluid to the liquid-air heat exchanger in the modified cabinet. The waste heat utilization equipment, after completing the waste heat utilization, needs to supplement refrigerating fluid to the condenser.

Compared with the prior art, the present disclosure has the following beneficial technical effects:

(A) A physical architecture arrangement scheme of entirely integrating a fuel cell system, a server group as well as their coupling cooling equipment into a conventional 42U cabinet of the data center is described in detail, which is intuitive and feasible, achieves the organic coupling of the fuel cell system and the server group in the cabinet of the data center, and is conducive to promoting the implementation of the engineering of applying hydrogen fuel cells to the data center.

(B) It can be seen from the embodiments that the integration space of subsystems supporting the operation of the fuel cell stack in a single cabinet is considered, and the solution of combining hydrogen supply, air supply, and exhaust processing required by the fuel cell work with the computer room and cabinet of the data center is put forward, and the deep coupling between the fuel cell system and the data center is achieved. The main energy generation body is set as the hydrogen fuel cell, and thus the distributed hydrogen fuel cells can be directly used by the data center server for green power supply. Moreover, for some of the data centers that have been built, the data centers that have been built and operated can be directly transformed into data centers that fully use green electricity at a lower cost.

(C) In accordance with the present disclosure, the coolant circulation of the traditional data center is adopted to cool the servers and the fuel cells, and the temperature demands of the coolant of the servers and the coolant of the fuel cell stack are comprehensively considered, and a unified cooling scheme in which the coolant firstly cools the server, and then a stream of coolant is separated off to cool the fuel cells is put forward. In a case that the parameter selection of the relevant heat exchanger is proper, the stable cooling of the fuel cell stack and the server can be achieved through simple flow regulation, and the returned liquid at a higher temperature can also be obtained for waste heat utilization.

(D) When the cabinet designed by the present disclosure is applied to the actual data center, refrigerating fluid is supplied by a large condenser, and the refrigeration efficiency of centralized refrigeration is high at the moment. For example, if the natural cold source is used for refrigeration instead of the condenser, and the efficiency of waste heat recovery of high-temperature returned liquid is considered, the overall system efficiency is higher than that of combined cooling, heating, and power of the fuel cell.

(E) Hybrid electricity supply schemes matched with the fuel cell, the lithium battery, and the mains supply are designed for the direct current servers and the alternating current servers, respectively, and the stable energy supply and zero-carbon energy consumption of the servers can be achieved by using the fuel cell power generation as the power source of the servers, using the mains supply as standby electricity, and matching with the lithium battery.

(F) The scheme of the present disclosure is reasonable and easy to implement, which can give full play to the flexibility of zero-carbon (low-carbon) direct current power supply of the fuel cells and distributed cabinet power supply, as well as the advantages of medium-temperature waste heat utilization of hydrogen fuel cells.

The foregoing, and other features and advantages of the invention, will be apparent from the following, more particular description of the preferred embodiments of the invention, the accompanying drawings, and the claims.

BRIEF DESCRIPTION OF THE DRAWINGS

These and other features, aspects, and advantages are described below with reference to the drawings, which are intended to illustrate, but not to limit, the invention. In the drawings, like characters denote corresponding features consistently throughout similar embodiments.

COMPONENT INDEX

1—Cabinet body
2—Standard server group
3—Liquid-air heat exchanger
4—Fan matrix
5—Fuel cell stack
6—Plate heat exchanger
7—Fuel cell control module
8—Hydrogen supply module
9—Air supply module
10—Exhaust processing module
11—Computer room air
12—Flow distribution valve
13—Heat storage tank
14—Condenser
15—Cold source system
16—Liquid pump
17—Waste heat utilization equipment

DETAILED DESCRIPTION OF THE EMBODIMENTS

The following are specific embodiments of the present disclosure. It should be noted that the present disclosure is not limited to the following specific embodiments, and all equivalent changes made on the basis of the technical solution of the present disclosure shall fall within the scope of protection of the present disclosure.

Following the above technical solution, as shown in FIGS. 1, 2, 3, and 4, the embodiment provides a system architecture for coupling fuel cells and data center, including a physical architecture inside a cabinet, a coupled thermal management scheme of the fuel cells and the data center, and an electricity management scheme of servers, and a data center construction scheme capable of achieving zero carbon of power consumption and efficient cooling is provided.

Figure 1:
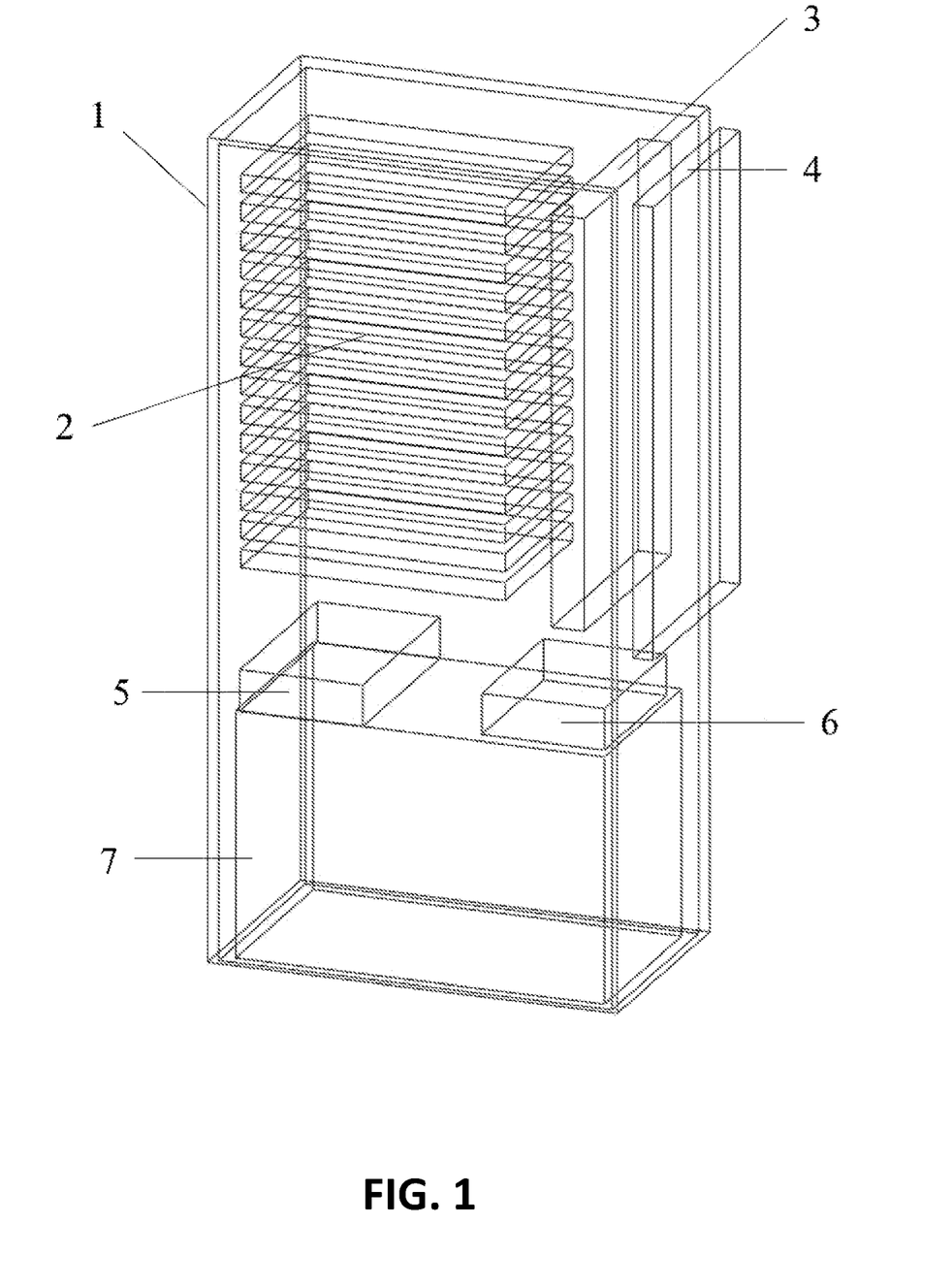
FIG. 1 is a schematic diagram of a single cabinet and main devices in the cabinet in accordance with the present disclosure.
Figure 2:
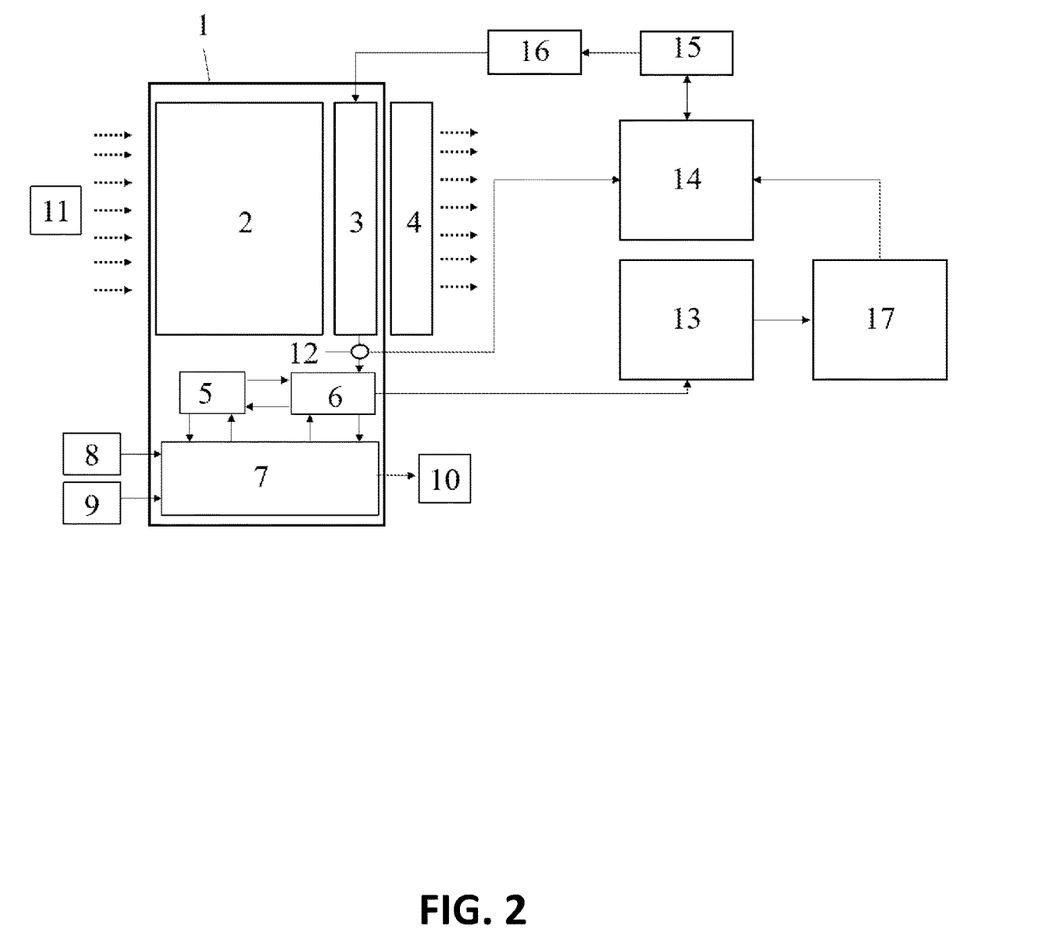
FIG. 2 is a schematic diagram of a design scheme of a refrigeration system in accordance with the present disclosure.

A distributed fuel cell power supply cabinet provided by the present disclosure includes the following parts:

Cabinet body modification: the following entities are sequentially arranged in a cabinet body from top to bottom: a standard server group 2, a liquid-air heat exchanger 3, a fan matrix 4, a fuel cell stack 5, a fuel cell plate heat exchanger 6, and a fuel cell control module 7. The cabinet body needs to be modified to a certain extent, as shown in FIG. 2, the front face and the back face of the cabinet need to be perforated and provided with pipelines, thus ensuring that a hydrogen supply module 8, an air supply module 9 and an exhaust processing module 10 may be physically connected to the fuel cell control module 7.

Figure 3:
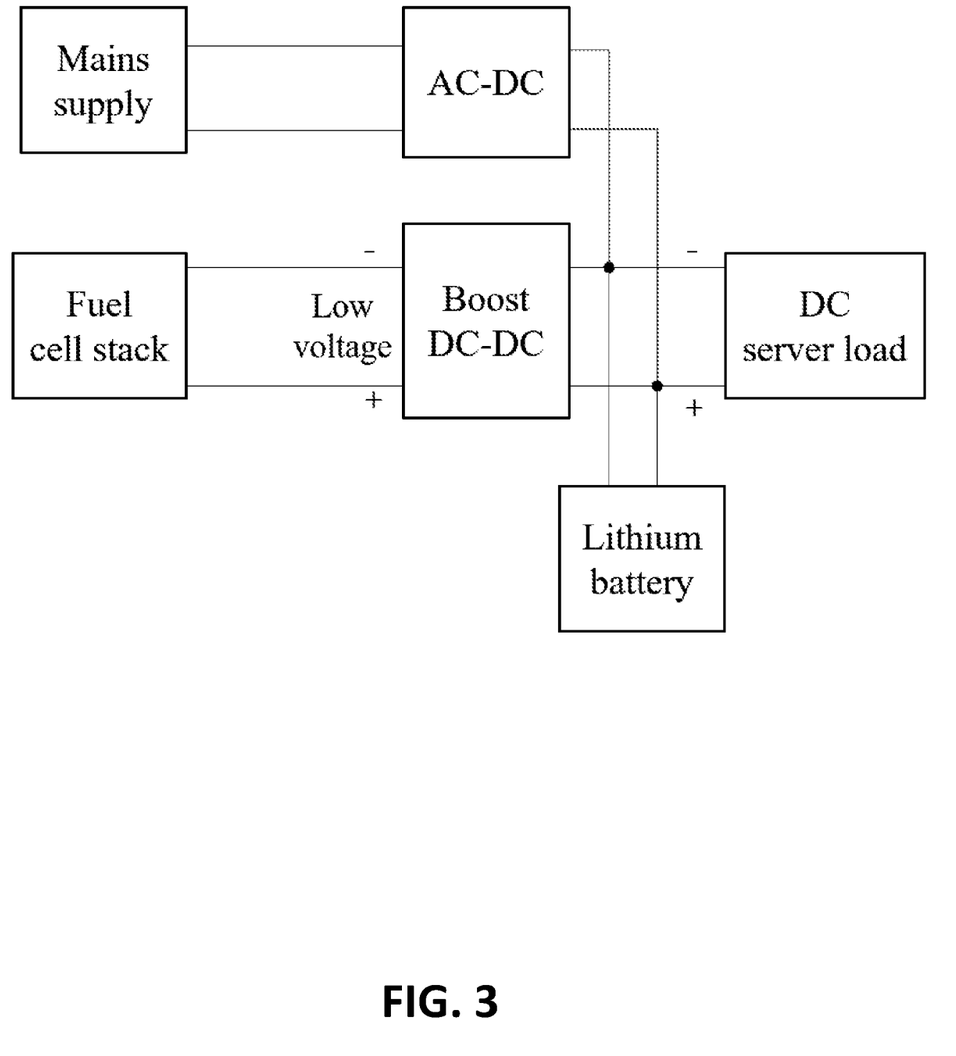
FIG. 3 is a circuit design diagram of a direct current server load in accordance with the present disclosure.
Figure 4:
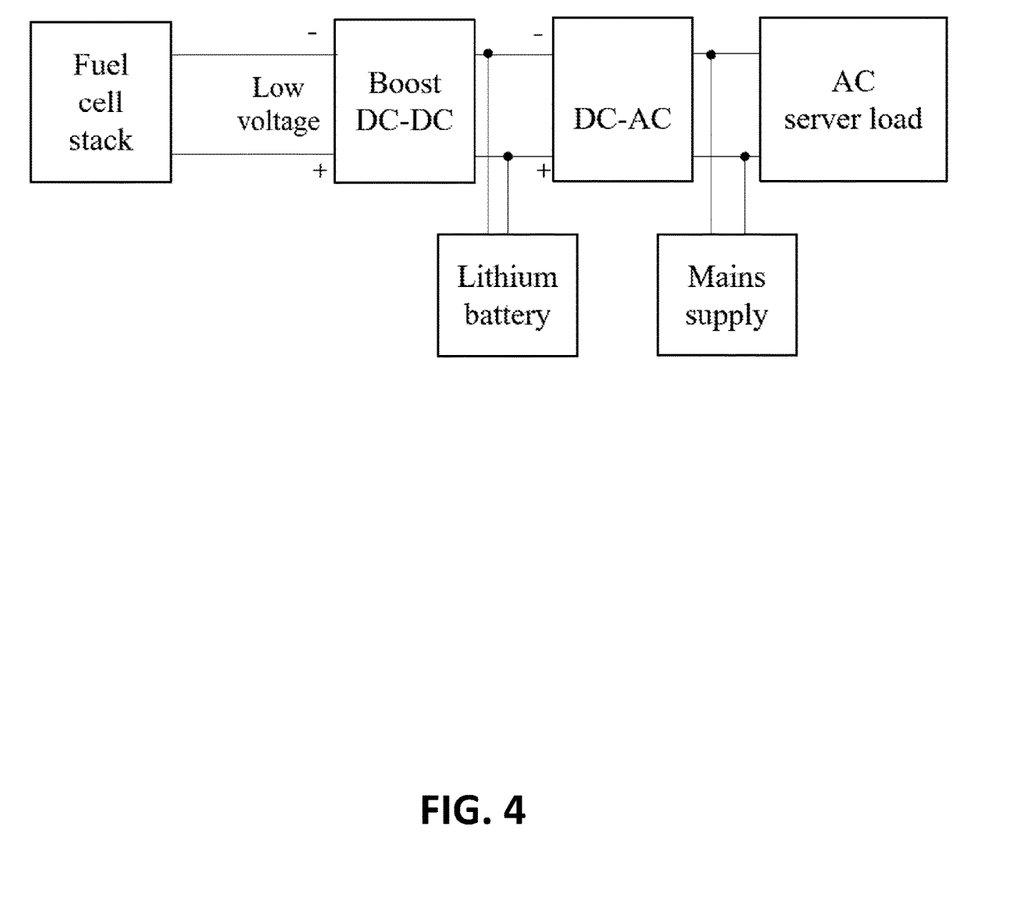
FIG. 4 is a circuit design diagram of an alternating current server load in accordance with the present disclosure.

A fuel cell system is integrated in the cabinet, taking this instance as an example, it is required that the dimension of the fuel cell control module 7 cannot exceed 500 mm*900 mm*800 mm, including a hydrogen module, an air module, a cooling module, an exhaust module, and a power source module. The hydrogen module is integrated with a pressure-reducing valve, a solenoid valve, a hydrogen ejector, as well as necessary pipelines. The hydrogen module is connected to the hydrogen supply module 8 outside the cabinet, and the hydrogen module and the hydrogen supply module 8 are configured to commonly complete the hydrogen supply of the fuel cell stack. The air module is integrated with an air filter, an air blower, a humidifier, as well as necessary pipelines. The air module is connected to the air supply module 9 and is configured to supply air outside the data center to the fuel cell stack through the pipelines. The exhaust module mainly consists of exhaust pipelines, the exhaust module is connected to the exhaust processing module 10, the exhaust mixture mixed with part of hydrogen, air, and water discharged from the fuel cell stack is discharged outside the computer room, and it can be ensured that the hydrogen concentration in the exhaust is within a safe range by means of gas addition and mixing. The hydrogen module, the hydrogen supply module 8, the air module, the air supply module 9, the exhaust module, and the exhaust processing module 10 may work together according to the working conditions of the fuel cell stack 5 so as to complete the hydrogen supply demand, the air supply demand and the exhaust demand of the fuel cell stack 5. The function of the power source module is to convert a low-voltage high current of the fuel cell stack into a high-voltage low current available for servers of the data center. For a DC server load, as shown in FIG. 3, an output voltage of the fuel cell is boosted, and then the other side of the boosted DC-DC is connected to a lithium battery in parallel to provide stable direct current electricity for the servers; and mains supply is converted into a voltage required by a direct current load through an AC-DC inverter, which serves as standby electricity for the server on a direct current bus. For an alternative current-powered server, a circuit design is as shown in FIG. 4, after the fuel cell output voltage is boosted and then is connected to a lithium battery in parallel, the direct current is converted into alternating current by a DC-AC converter so as to be provided for the server, as the alternating current is at the terminal of the DC-AC converter, the mains supply is reserved in the alternating current bus to serve as a standby power supply.

Support equipment for the operation of the fuel cell is as follows: As shown in FIG. 2, to guarantee the operation of the fuel cell, supply support pipelines need to be installed at proper positions on the front side and rear side of each cabinet, including a hydrogen supply module 8, an air supply module 9, and an exhaust processing module 10. The hydrogen supply module 8 needs to be connected to a hydrogen storage tank of the data center to achieve stable hydrogen supply pressure, and a hydrogen leakage monitoring sensor is provided, thus when the leakage is detected, the hydrogen supply can be interrupted, and the power supply is switched from the fuel cell to the mains supply. The air supply module 9 includes a necessary pipeline and air-blowing and pressurizing equipment, which needs to achieve a stable supply of necessary airflow for the operation of the fuel cell and physical isolation from the air environment inside the computer room. The exhaust processing module 10 also adopts a way of laying pipelines, through which the mixture containing hydrogen, air, water vapor, and liquid water is discharged to the outside of the computer room.

Cooling equipment outside the computer room is as follows: As shown in FIG. 2, the outside of the computer room is provided with a heat storage tank 13, a condenser 14, a cold source system 15, a liquid pump 16, and waste heat utilization equipment 17. The capacity selection of condenser 14 is matched with the overall coolant demand of the data center. The heat storage tank is configured to store and deliver high-temperature returned liquid from the computer room to the waste heat utilization equipment 17. According to different waste heat utilization schemes, equipment 17 needs to supplement and supply coolant to the condenser 14, which may be the used coolant after waste heat utilization or additionally supplemented coolant, with the purpose of guaranteeing the flow conservation of the coolant circulation of the computer room. The condenser 14 is configured to cool the low-temperature returned liquid of the computer room and the supplemented coolant of the waste heat utilization equipment to the temperature required for the cooling of the computer room, and then the cooled liquid is stored in the cold source system 15 and is delivered to the liquid-air heat exchanger 4 in the computer room by the liquid pump 16 to form the cooling circulation.

The following describes the operation process of the present disclosure in detail by taking a design instance as the basis.

By taking a single cabinet direct current load as an example, assuming that the server load of the cabinet is 5 kW and the total power supply conversion loss of the fuel cell stack by electricity conversion equipment such as a DC-DC converter is 10%, the generation output power of the fuel cell system needs to reach 5.56 kW to meet the electricity demand of the cabinet.

Assuming that the electric power of the server is finally converted into heat power and the water is used as the coolant, the heat taken away by liquid-air heat exchanger 3 through the coolant is 5 kW. Assuming that the feeding temperature and the returning temperature of the coolant are 20° C. and 25° C., respectively, the flow rate of the coolant required by the single cabinet is about 0.238 kg/s (5 kW/5 K/4.2 kJ·kg$^{-1}$K$^{-1}$).

Assuming that the electric power output by the fuel cell system accounts for 80% of the total generation power when powering a server array of 5 kW, the fuel cell stack has an actual electric power generation power of 6.94 kW (5 kW/0.9/0.8). Assuming that the power generation efficiency of the fuel cell stack is 50%, then the corresponding fuel cell heating power is also 6.94 kW, i.e., the low-temperature returned liquid needs to take away 6.94 kW of heat power from the fuel cell system, and the heat transfer process is generated in the plate heat exchanger 6. For the plate heat exchanger 6, the inlet temperature of the low-temperature returned liquid is 25° C., the designed outlet temperature is 60° C., and the flow rate of the coolant at the moment is 0.0472 kg/s (6.94 kW/35K/4.2 kJ·kg$^{-1}$K$^{-1}$), accounting for about 20% of the coolant supply flow rate of the single cabinet, and the liquid quantity delivered to the plate heat exchanger of the fuel cell can be adjusted to the above value according to the arranged flow distribution valve 12 in FIG. 2.

The returned liquid delivered to the external by the cabinet is divided into two streams, one is low-temperature returned liquid at 25° C., and the other is high-temperature returned liquid at 60° C. The low-temperature returned liquid is delivered to the condenser for refrigeration and circularly pumped into the computer room. The high-temperature returned liquid is first delivered into the heat storage module 13 and then supplied to the waste heat utilization equipment 17. Finally, waste heat utilization equipment 17 needs to supplement the circulating coolant to the condenser 14.

While the present disclosure has been described in detail with general description and specific embodiments, it is apparent to those skilled in the art that some modifications or improvements can be made on the basis of the present disclosure. Therefore, these modifications or improvements made without departing from the spirit of the present disclosure all belong to the scope of protection of the present disclosure. The section headings and subheadings provided herein are nonlimiting. The section headings and subheadings do not represent or limit the full scope of the embodiments described in the sections to which the headings and subheadings pertain. For example, a section titled "Topic 1" may include embodiments that do not pertain to Topic 1 and embodiments described in other sections may apply to and be combined with embodiments described within the "Topic 1" section.

The various features and processes described above may be used independently of one another, or may be combined in various ways. All possible combinations and subcombinations are intended to fall within the scope of this disclosure. In addition, certain method, event, state, or process blocks may be omitted in some implementations. The methods, steps, and processes described herein are also not limited to any particular sequence, and the blocks, steps, or states relating thereto can be performed in other sequences that are appropriate. For example, described tasks or events may be performed in an order other than the order specifically disclosed. Multiple steps may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require at least one of X, at least one of Y, and at least one of Z to each be present.

The term "and/or" means that "and" applies to some embodiments and "or" applies to some embodiments. Thus, A, B, and/or C can be replaced with A, B, and C written in one sentence and A, B, or C written in another sentence. A, B, and/or C means that some embodiments can include A and B, some embodiments can include A and C, some embodiments can include B and C, some embodiments can only include A, some embodiments can include only B, some embodiments can include only C, and some embodiments can include A, B, and C. The term "and/or" is used to avoid unnecessary redundancy.

We claim:

1. A distributed fuel cell power supply cabinet, comprising:
   a modified cabinet integrated with a fuel cell system, and a coupled thermal management system of a fuel cell and a data center,
      wherein the fuel cell system integrated in a lower part of the modified cabinet, and a server group and cooling equipment integrated in an upper part of the modified cabinet;
   the fuel cell system comprising a fuel cell stack, a plate heat exchanger, and a fuel cell control module;
   the fuel cell control module comprising a hydrogen module, an air module, a cooling module, an exhaust module, and a power source module,
      wherein the fuel cell control module, the hydrogen module, the air module, the cooling module, and the exhaust module are coupled to the fuel cell stack by pipelines or circuits and are entirely integrated in the lower part of the modified cabinet,
      wherein the hydrogen module is coupled to a hydrogen supply module outside the modified cabinet by a pipeline,
      wherein a tail end of the hydrogen module is coupled to the fuel cell stack,
      wherein the air module is coupled to an air supply module outside the modified cabinet by a pipeline,
      wherein a tail end of the air module is coupled to the fuel cell stack,
      wherein the exhaust module is coupled to an exhaust processing module outside the modified cabinet by a pipeline,
      wherein a starting end of the exhaust module is coupled to the fuel cell stack,
      wherein the cooling module is in closed-loop connection with the fuel cell stack by pipelines,
      wherein the plate heat exchanger is a part of the cooling module, and a coolant of the plate heat exchanger is from a liquid outlet of a liquid-air heat exchanger, and
      wherein the power source module of the fuel cell control module is used for power supply;
   the upper part of the modified cabinet comprising the server group, the liquid-air heat exchanger, and a fan matrix, configured to work together to achieve the cooling of the server group; and
   the coupled thermal management system of the fuel cell and the data center comprising coupled management of a server thermal management, a fuel cell thermal management, and a computer room thermal management,
      wherein the server thermal management is achieved through the liquid-air heat exchanger and the fan matrix,
      wherein the fuel cell thermal management is achieved by discharging a part of low-temperature returned liquid from the liquid-air heat exchanger, and
      wherein the computer room thermal management is achieved through the cooling equipment outside a computer room of the data center.

2. The distributed fuel cell power supply cabinet according to claim 1, wherein the coolant of the liquid-air heat exchanger and the plate heat exchanger are both from the cooling equipment outside the computer room.

3. The distributed fuel cell power supply cabinet according to claim 2, wherein the coolant is selected from the group consisting of water, fluorinate liquid, and other coolant types commonly used in the data center.

4. The distributed fuel cell power supply cabinet according to claim 2, wherein the coolant at an inlet of the liquid-air heat exchanger is heated into low-temperature return liquid with a slightly higher temperature at the outlet of the liquid-air heat exchanger, after being discharged, the low-temperature returned liquid is diverted by a flow distribution valve, one part of which is delivered to the plate heat exchanger, and the other part is delivered to the cooling equipment outside the computer room of the data center, and
   wherein the low-temperature returned liquid delivered to the plate heat exchanger becomes a stream of high-temperature returned liquid after completing a heat transfer process in the plate heat exchanger, and then is delivered to an outside of the computer room by a heat insulation pipeline.

5. The distributed fuel cell power supply cabinet according to claim 1, wherein the power source module of the fuel cell control module adopts different configuration solutions according to a server load power input.

6. The distributed fuel cell power supply cabinet according to claim 1, wherein the modified cabinet and a data center 42U cabinet are consistent in geometric dimension, a front and a rear position of the modified cabinet are perforated to achieve an arrangement and connection of hydrogen, air and exhaust pipelines related to the fuel cell system.

7. The distributed fuel cell power supply cabinet according to claim 1, wherein the hydrogen supply module comprises a hydrogen cylinder, a pressure-reducing valve, as well as a pipeline system coupled to the computer room,
   wherein the air supply module comprises a compressor, a control valve, a filter, as well as a pipeline system coupled to the computer room, and wherein an exhaust treatment module comprises a hydrogen concentration monitor, as well as a pipeline system for collecting the exhaust of each cabinet and venting the exhaust outside the computer room.

8. The distributed fuel cell power supply cabinet according to claim 1, wherein when a server load is a direct current load, the power source module of the fuel cell control module is set as follows: the fuel cell stack is coupled to a boost DC-DC, mains supply is coupled to an AC-DC converter, and then the connected fuel cell stack and boost DC-DC and the connected mains supply and AC-DC converter are connected in parallel and then are connected to a lithium battery in parallel, and three paths are aggregated and then directly supplied to the server load, and wherein when the server load is an alternating current load, the power source module is set as follows: the fuel cell stack is coupled to a boost DC-DC, then the connected fuel cell stack and boost DC-DC is coupled to a lithium battery in parallel, the connected fuel cell stack and boost DC-DC and the lithium battery are aggregated and then coupled to a DC-AC converter to obtain alternating current, and then are coupled to the mains supply in parallel to supply power for the alternating current server load.

9. The distributed fuel cell power supply cabinet according to claim 1, wherein the cooling equipment outside the computer room of the data center comprises a condenser, a cold source system, a liquid pump, a heat storage tank, and a waste heat utilization equipment, wherein the condenser and the cold source system are configured to complete a generation and storage of a refrigerating fluid, and then the liquid pump is configured to pump the refrigerating fluid to the liquid-air heat exchanger in the modified cabinet, and wherein the waste heat utilization equipment, after completing the waste heat utilization, needs to supplement the refrigerating fluid to the condenser.

* * * * *